(12) United States Patent
Go et al.

(10) Patent No.: US 10,083,992 B2
(45) Date of Patent: Sep. 25, 2018

(54) DISPLAY DEVICE

(71) Applicant: SAMSUNG DISPLAY CO., LTD., Yongin-si, Gyeonggi-do (KR)

(72) Inventors: Jaekyung Go, Yongin-si (KR); Eunjae Na, Yongin-si (KR); Minjun Jo, Yongin-si (KR); Hyunjun Choi, Yongin-si (KR)

(73) Assignee: SAMSUNG DISPLAY CO., LTD., Yongin-si, Gyeonggi-do (KR)

( * ) Notice: Subject to any disclaimer, the term of this patent is extended or adjusted under 35 U.S.C. 154(b) by 0 days.

(21) Appl. No.: 15/616,580

(22) Filed: Jun. 7, 2017

(65) Prior Publication Data

US 2017/0271372 A1 Sep. 21, 2017

Related U.S. Application Data

(63) Continuation of application No. 14/662,568, filed on Mar. 19, 2015, now Pat. No. 9,679,919.

(30) Foreign Application Priority Data

Sep. 23, 2014 (KR) .......................... 10-2014-0127188

(51) Int. Cl.
*H01L 29/04* (2006.01)
*H01L 27/12* (2006.01)
(Continued)

(52) U.S. Cl.
CPC ........ *H01L 27/124* (2013.01); *H01L 27/3246* (2013.01); *H01L 27/3276* (2013.01);
(Continued)

(58) Field of Classification Search
CPC ............. H01L 27/3276; H01L 51/5246; H01L 27/124; H01L 27/1218; H01L 27/3246
(Continued)

(56) References Cited

U.S. PATENT DOCUMENTS 6,274,887 B1  8/2001 Yamazaki ............... H01L 27/12
                                                    257/204
6,359,606 B1  3/2002 Yudasaka ............ H01L 27/3246
                                                    313/483
(Continued)

FOREIGN PATENT DOCUMENTS

KR       2002-0069737 A    5/2002
KR    10-2003-0001572 A    1/2003
(Continued)

OTHER PUBLICATIONS

USPTO Actions and IDS submissions from co-pending related U.S. Appl. No. 14/677,085 filed prior to Jun. 7, 2017.
(Continued)

*Primary Examiner* — Luan C Thai
(74) *Attorney, Agent, or Firm* — Lee & Morse, P.C.

(57) ABSTRACT

A display device includes a first substrate having an active area, a circuit area extending outwardly from the active area, and a cell seal area extending outwardly from the circuit area, a second substrate covering the first substrate, a sealing part between the first substrate and the second substrate, the sealing part covering at least a portion of the circuit area, a wiring part in the circuit area of the first substrate and electrically connected to elements in the active area of the first substrate, the wiring part including at least one level-difference compensation part, and a stepped part between the sealing part and at least a portion of the wiring part, the at least one level-difference compensation part of the wiring part being adjacent to the stepped part.

14 Claims, 7 Drawing Sheets

(51) Int. Cl.
  *H01L 51/52* (2006.01)
  *H01L 27/32* (2006.01)
(52) U.S. Cl.
  CPC ...... *H01L 51/5246* (2013.01); *H01L 27/3223* (2013.01); *H01L 27/3262* (2013.01); *H01L 51/525* (2013.01); *H01L 2227/323* (2013.01)
(58) Field of Classification Search
  USPC .......................................................... 257/59
  See application file for complete search history.

(56) References Cited

U.S. PATENT DOCUMENTS

| | | | |
|---|---|---|---|
| 6,380,687 B1 | 4/2002 | Yamazaki | G09G 3/3233 315/169.1 |
| 6,420,834 B2 | 7/2002 | Yamazaki | H01L 27/3246 313/238 |
| 6,559,594 B2 | 5/2003 | Fukunaga | H01L 51/0097 257/E27.111 |
| 6,572,987 B2 | 6/2003 | Seo | C09K 11/06 257/88 |
| 6,593,691 B2 | 7/2003 | Nishi | H01L 27/3244 313/310 |
| 6,605,826 B2 | 8/2003 | Yamazaki | H01L 27/32 257/359 |
| 6,664,732 B2 | 12/2003 | Yamazaki | H01L 27/3244 313/504 |
| 6,706,544 B2 | 3/2004 | Yamazaki | H01L 27/1214 257/E21.413 |
| 6,798,132 B2 | 9/2004 | Satake | H01L 27/322 257/347 |
| 6,822,264 B2 | 11/2004 | Yamazaki | H01L 27/12 257/49 |
| 6,900,462 B2 | 5/2005 | Suzawa | |
| 6,965,195 B2 | 11/2005 | Yamazaki | H01L 51/5259 257/72 |
| 7,037,157 B2 | 5/2006 | Murakami | H01L 27/3246 445/24 |
| 7,097,916 B2 | 8/2006 | Seo | C09K 11/06 252/301.16 |
| 7,098,069 B2 | 8/2006 | Yamazaki | H01L 27/3258 438/22 |
| 7,129,623 B2 | 10/2006 | Chou et al. | |
| 7,196,465 B2 | 3/2007 | Park | |
| 7,423,373 B2 | 9/2008 | Sakakura | H01L 27/3248 313/504 |
| 7,473,928 B1 | 1/2009 | Yamazaki | H01L 51/0003 257/59 |
| 7,486,368 B2 | 2/2009 | Sakakura | H01L 51/5237 349/153 |
| 7,538,488 B2 | 5/2009 | Kwak | |
| 7,550,772 B2 | 6/2009 | Toyota | H01L 29/4908 257/347 |
| 7,592,207 B2 | 9/2009 | Nakamura | H01L 27/12 438/149 |
| 7,611,965 B2 | 11/2009 | Suzuki | H01L 27/12 257/E21.6 |
| 7,619,258 B2 | 11/2009 | Tsuchiya | H01L 27/3246 257/40 |
| 7,619,286 B2 | 11/2009 | Park | G02F 1/133512 257/390 |
| 7,728,510 B2 | 6/2010 | Oh | H01L 27/3276 313/499 |
| 7,753,751 B2 | 7/2010 | Yamazaki | H01L 27/3246 313/506 |
| 7,775,845 B2 | 8/2010 | Fukase | H01L 51/0018 445/23 |
| 7,839,081 B2 | 11/2010 | Kubota | H01L 27/3244 313/501 |
| 7,928,654 B2 | 4/2011 | Tsuchiya | H01L 27/3244 313/483 |
| 7,968,453 B2 | 6/2011 | Tanaka | |
| 7,989,812 B2 | 8/2011 | Yamazaki | H01L 51/0003 257/40 |
| 8,026,667 B2 | 9/2011 | Kwak | H01L 27/3276 313/500 |
| 8,044,574 B2* | 10/2011 | Yamazaki | H01L 27/3246 313/504 |
| 8,076,844 B2 | 12/2011 | Oda | H01L 27/3246 313/504 |
| 8,093,603 B2 | 1/2012 | Jung | H01L 27/3246 257/57 |
| 8,164,252 B2 | 4/2012 | Lee | H01L 27/3246 313/504 |
| 8,164,257 B2 | 4/2012 | Choi | |
| 8,218,111 B2 | 7/2012 | Kim | G02F 1/133512 349/106 |
| 8,222,809 B2 | 7/2012 | Lee | H01L 27/3258 313/506 |
| 8,253,327 B2 | 8/2012 | Ibe et al. | |
| 8,304,300 B2 | 11/2012 | Sakata | |
| 8,350,466 B2 | 1/2013 | Murakami | H01L 51/5237 257/59 |
| 8,357,021 B2 | 1/2013 | Sakakura | H01L 29/78654 313/506 |
| 8,362,469 B2 | 1/2013 | Suh | H01L 27/3279 257/40 |
| 8,368,299 B2 | 2/2013 | Kim | H01L 51/5281 313/112 |
| 8,415,881 B2 | 4/2013 | Satake | H01L 27/322 313/512 |
| 8,432,334 B2 | 4/2013 | Bang | |
| 8,441,185 B2 | 5/2013 | Kuwabara | H01L 27/3246 313/504 |
| 8,445,915 B2 | 5/2013 | You | H01L 27/3248 257/449 |
| 8,455,873 B2 | 6/2013 | Yamazaki | G02F 1/136227 257/59 |
| 8,587,194 B2 | 11/2013 | Lee | H01L 27/12 257/59 |
| 8,604,501 B2 | 12/2013 | Yun | B82Y 20/00 257/40 |
| 8,618,546 B2 | 12/2013 | Jeong | H01L 27/1225 257/379 |
| 8,629,448 B2 | 1/2014 | Kang | H01L 27/1214 257/72 |
| 8,716,933 B2 | 5/2014 | Yamazaki | G01N 33/497 257/79 |
| 8,853,702 B2 | 10/2014 | Jin | H01L 27/3262 257/40 |
| 8,890,151 B2 | 11/2014 | Hong | H01L 27/3246 257/59 |
| 9,076,990 B2 | 7/2015 | Nakamura | |
| 9,153,631 B2 | 10/2015 | Sung et al. | |
| 9,236,495 B2 | 1/2016 | Seo | H01L 29/66969 |
| 9,281,494 B2 | 3/2016 | Lee | |
| 9,312,319 B2 | 4/2016 | Lee et al. | |
| 9,412,801 B2 | 8/2016 | Choi | |
| 9,570,702 B2 | 2/2017 | Hong | |
| 9,825,253 B2 | 11/2017 | Cho | |
| 2001/0053559 A1 | 12/2001 | Nagao | |
| 2002/0149730 A1 | 10/2002 | Jeong et al. | |
| 2003/0132927 A1 | 7/2003 | Ouchi | H01L 27/3248 345/204 |
| 2005/0048706 A1 | 3/2005 | Shimomura | H01L 21/2026 438/197 |
| 2006/0088951 A1 | 4/2006 | Hayashi | H01L 51/5237 438/99 |
| 2008/0063949 A1 | 3/2008 | Inoue | H01L 27/3246 430/5 |
| 2008/0277666 A1 | 11/2008 | Jeon | H01L 27/3244 257/66 |
| 2012/0043880 A1 | 2/2012 | Lee | |
| 2012/0075781 A1 | 3/2012 | Koh et al. | |
| 2012/0181544 A1 | 7/2012 | Lee | H01L 27/3246 257/72 |
| 2012/0249937 A1 | 10/2012 | Kim | G02F 1/133512 349/106 |

(56) References Cited

U.S. PATENT DOCUMENTS

| | | | |
|---|---|---|---|
| 2013/0049003 A1* | 2/2013 | Choi | H01L 51/5246 257/72 |
| 2013/0069067 A1 | 3/2013 | Youn | H01L 27/3279 257/59 |
| 2013/0069853 A1 | 3/2013 | Choi | H01L 27/3276 345/80 |
| 2013/0248867 A1 | 9/2013 | Kim | H01L 51/5253 257/59 |
| 2013/0300775 A1 | 11/2013 | Choi | G02B 26/005 345/690 |
| 2014/0027729 A1 | 1/2014 | So et al. | |

FOREIGN PATENT DOCUMENTS

| | | |
|---|---|---|
| KR | 10-2011-0041321 A | 4/2011 |
| KR | 10-2012-0017928 A | 2/2012 |
| KR | 10-2012-0031366 A | 4/2012 |
| KR | 10-2014-0013521 A | 2/2014 |
| KR | 10-2014-0015037 A | 2/2014 |

OTHER PUBLICATIONS

Non-Final Office action dated Jan. 10, 2018 in co-pending, related U.S. Appl. No. 14/677,085.

* cited by examiner

DISPLAY DEVICE

CROSS-REFERENCE TO RELATED APPLICATIONS

This is a continuation application based on pending application Ser. No. 14/662,568, filed Mar. 19, 2015, the entire contents of which is hereby incorporated by reference.

Korean Patent Application No. 10-2014-0127188, filed on Sep. 23, 2014, in the Korean Intellectual Property Office, and entitled: "Display Device," is incorporated by reference herein in its entirety.

BACKGROUND

1. Field

One or more exemplary embodiments relate to a display device.

2. Description of the Related Art

Commonly, display devices, e.g., organic light-emitting display devices including thin-film transistors (TFTs), are attracting attention, since the display devices may be implemented in mobile devices, e.g., smartphones, tablet personal computers, super-slim laptop computers, digital cameras, video cameras, and portable information terminals, as well as in electronic/electric products, e.g., super-slim televisions. The display device require sealing between upper and lower substrates to protect elements therebetween, e.g., an organic light emitting diode, from the outside.

SUMMARY

According to one or more exemplary embodiments, a display device includes a first substrate having an active area, a circuit area extending outwardly from the active area, and a cell seal area extending outwardly from the circuit area, a second substrate covering the first substrate, a sealing part between the first substrate and the second substrate, the sealing part covering at least a portion of the circuit area, a wiring part in the circuit area of the first substrate and electrically connected to elements in the active area of the first substrate, the wiring part including at least one level-difference compensation part, and a stepped part between the sealing part and at least a portion of the wiring part, the at least one level-difference compensation part of the wiring part being adjacent to the stepped part.

The display device may further include a dummy metal layer disposed below the one or more level-difference compensation parts such that the dummy metal layer overlaps the one or more level-difference compensation parts.

The display device may further include an insulating layer disposed between the wiring part and the dummy metal layer.

The stepped part may be a pixel-defining layer or a planarization layer.

A width of the one or more level-difference compensation parts may be 50 µm or less.

The one or more level-difference compensation parts may be disposed in a line with a predetermined spacing.

A plurality of protrusion parts may be disposed on the one or more level-difference compensation parts.

The wiring part may be a circuit wiring or a power wiring.

The at least one level-difference compensation part of the wiring part may protrude above peripheral portions of the wiring part toward the stepped part.

A distance between a top of the stepped part and a top of the at least one level-difference compensation part may be smaller than a difference between the top of the stepped part and a top of a peripheral portion of the wiring part.

The at least one level-difference compensation part may include a plurality of level-difference compensation parts stacked on top of each other.

The display device may further include a first dummy metal layer below a first level-difference compensation part, the first dummy metal layer overlapping the first level-difference compensation part, and a second dummy metal layer below a second level-difference compensation part, the second level-difference compensation part being on the first level-difference compensation part, and the second dummy metal layer overlapping the second level-difference compensation part.

According to one or more exemplary embodiments, a display device includes a first substrate having an active area, a circuit area extending outwards from the active area, and a cell seal area extending outwards from the circuit area; a second substrate which covers the first substrate, and a sealing part which is formed between the first substrate and the second substrate and covers a portion of the circuit area, wherein a wiring part electrically connected to elements in the active area is provided in the circuit area, a stepped part is disposed between the sealing part and at least a portion of the wiring part, and a plurality of level-difference compensation parts are formed in a stack form such that the plurality of level-difference compensation parts are adjacent to the stepped part.

The plurality of level-difference compensation parts may include a first level-difference compensation part and a second level-difference compensation part disposed on the first level-difference compensation part, and the display device may further include: a first dummy metal layer disposed below the first level-difference compensation part such that the first dummy metal layer overlaps the first level-difference compensation part, and a second dummy metal layer disposed below the second level-difference compensation part such that the second dummy metal layer overlaps the second level-difference compensation part.

The display device may further include a first insulating layer disposed between the wiring part and the first dummy metal layer, and a second insulating layer disposed between the first insulating layer and the second dummy metal layer.

The stepped part may be a pixel-defining layer or a planarization layer.

A width of the first level-difference compensation part may be 50 µm or less.

Each of the plurality of level-difference compensation parts may include an uneven part.

The wiring part may be a circuit wiring or a power wiring.

BRIEF DESCRIPTION OF THE DRAWINGS

Features will become apparent to those of ordinary skill in the art by describing in detail exemplary embodiments with reference to the attached drawings, in which.

DETAILED DESCRIPTION

Reference will now be made in detail to exemplary embodiments, examples of which are illustrated in the accompanying drawings, wherein like reference numerals refer to like elements throughout. In this regard, the present exemplary embodiments may have different forms and should not be construed as being limited to the descriptions set forth herein. Accordingly, the exemplary embodiments are merely described below, by referring to the figures, to explain aspects of the present description.

Sizes of elements in the drawings may be exaggerated for convenience of explanation. In other words, since sizes and thicknesses of components in the drawings are illustrated for convenience of explanation, the following embodiments are not limited thereto.

It will be understood that although the terms "first", "second", etc. may be used herein to describe various components, these components should not be limited by these terms. These components are only used to distinguish one component from another.

The terminology in the application is used only to describe specific embodiments and does not have any intention to limit. An expression in the singular includes an expression in the plural, unless they are clearly different from each other in context. In the application, it should be understood that terms, such as 'include' and 'have', are used to indicate the existence of an implemented feature, number, step, operation, element, part, or a combination thereof without excluding in advance the possibility of the existence or addition of one or more other features, numbers, steps, operations, elements, parts, or combinations thereof.

It will be understood that when a layer, region, or component is referred to as being "on" another layer, region, or component, it can be directly or indirectly on the other layer, region, or component. That is, for example, intervening layers, regions, or components may be present. Further, as used herein, expressions such as "at least one of," when preceding a list of elements, modify the entire list of elements and do not modify the individual elements of the list.

Figure 1:
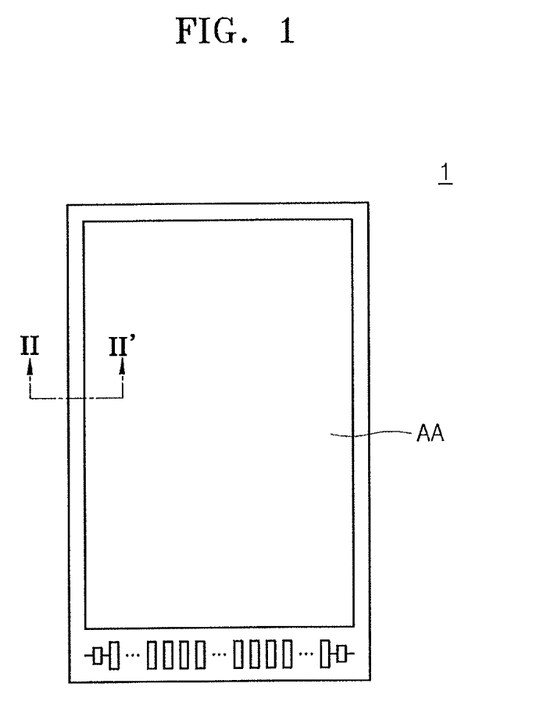
FIG. 1 illustrates a schematic top view of a portion of a display device according to an exemplary embodiment.
Figure 2:
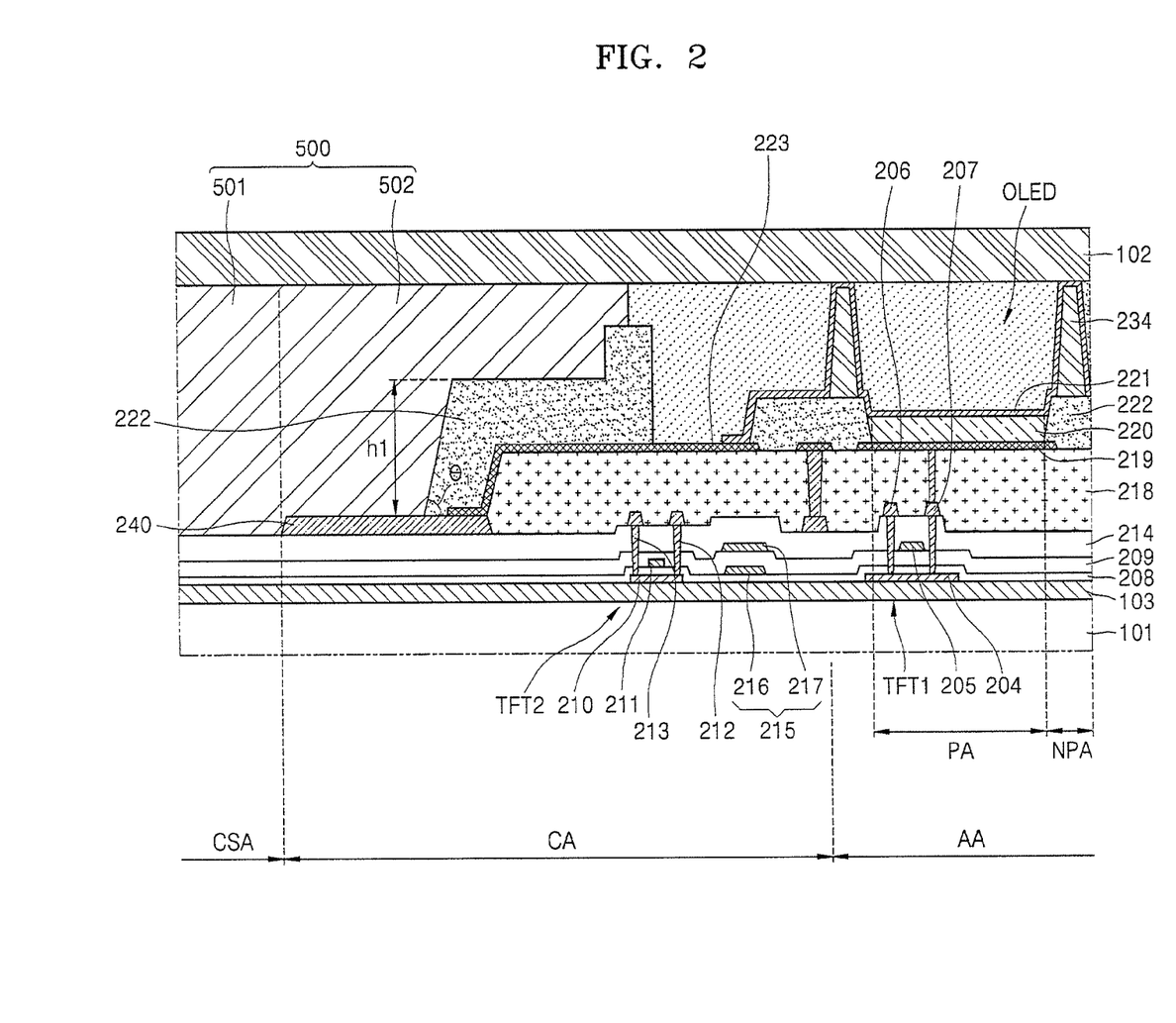
FIG. 2 illustrates a cross-sectional view along line II-II' of FIG. 1.

FIG. 1 is a schematic top view of a portion of a display device 1 according to an exemplary embodiment. FIG. 2 is a cross-sectional view along line II-II' of FIG. 1.

In the present embodiment, the display device 1 will be described using an organic light-emitting display device as an example, but the display device 1 is not limited to any one display device. That is, the display device 1 may be any display device for realizing an image by applying predetermined power thereto, e.g., a liquid crystal display (LCD) device, a field emission display (FED) device, an electronic paper display (EPD) device, or the like.

Referring to FIGS. 1 and 2, the display device 1 according to the present embodiment includes a first substrate 101 and a second substrate 102. The first substrate 101 includes a display area (or active area) AA, a circuit area CA extending outward from the display area AA, and a cell seal area CSA extending outward from the circuit area CA. That is, the circuit area CA is between the display area AA and the cell seal area CSA, while the display area AA is an area in which an image is displayed.

For example, a width of the cell seal area CSA, in which a sealing part 500 is formed, or a margin of a cutting area (not shown) for separating an individual display device may be reduced in the display device 1, in order to reduce a dead space, which is an area not associated with the display area AA. However, when the width of the cell seal area CSA or margin is reduced, a width of the sealing part 500 is reduced, thereby decreasing an adhesive force between the first substrate 101 and the second substrate 102.

In contrast, in the present embodiment, the sealing part 500 extends in the cell seal area CSA and the circuit area CA, in which a circuit wiring 223 and a power wiring 240 are arranged, in order to ensure sufficient adhesive force between the first substrate 101 and the second substrate 102. As such, the width of the cell seal area CSA may be reduced to minimize the dead space, while simultaneously the increased width of the sealing part 500 increases the adhesive force between the first substrate 101 and the second substrate 102. A detailed configuration of the display device 1 will now be described with reference to FIG. 2.

Referring to FIG. 2, the first substrate 101 may be a flexible substrate and may be formed of plastic having excellent heat resistance and durability. However, the present embodiment is not limited thereto, and the first substrate 101 may be formed of various materials, e.g., metal, glass and the like.

A barrier layer 103 may be formed on the first substrate 101. The barrier layer 103 functions to smooth a surface of the first substrate 101 and to prevent permeation of humidity and external air. The barrier layer 103 may have a structure in which an inorganic layer, e.g., silicon oxide, an organic layer, e.g., polyimide, or a combination thereof is stacked.

At least one thin-film transistor TFT may be formed in the active area AA and the circuit area CA. A plurality of thin-film transistors TFT may be formed. For example, first and second thin-film transistors TFT1 and TFT2 may be formed in the active area AA and the circuit area CA, respectively. However, this is only illustrative, and the present embodiment is not limited thereto.

The first thin-film transistor TFT1 disposed in the active area AA includes a first semiconductor active layer 204, a first gate electrode 205, a first source electrode 206, and a first drain electrode 207. A first gate insulating layer 208 and a second gate insulating layer 209 for insulating the first gate electrode 205 from the first semiconductor active layer 204 may be interposed therebetween.

The second thin-film transistor TFT2 disposed in the circuit area CA includes a second semiconductor active layer 210, a second gate electrode 211, a second source electrode 212, and a second drain electrode 213. The first gate insulating layer 208 for insulating the second gate electrode 211 from the second semiconductor active layer 210 may be interposed therebetween.

Compared with the second thin-film transistor TFT2, the first thin-film transistor TFT1 further includes the second gate insulating layer 209 between the first semiconductor active layer 204 and the first gate electrode 205 and, thus, has a thicker gate insulating layer. With the thicker gate insulating layer, a driving range of a gate voltage to be applied to a gate electrode may be wider. For example, when the first thin-film transistor TFT1 is a driving thin-film transistor for driving an organic light-emitting diode OLED, a driving range of the first thin-film transistor TFT1 is wide, and thus, light emitted by the organic light-emitting diode OLED may be controlled to have relatively fluent gradation. In addition, since the first gate electrode 205 of the first thin-film transistor TFT1 and the second gate electrode 211 of the second thin-film transistor TFT2 are formed in different layers, even when the first thin-film transistor TFT1 and the second thin-film transistor TFT2 are disposed to be adjacent to each other, interference therebetween does not occur, and thus, a larger number of elements may be disposed in a same area.

The first semiconductor active layer 204 and the second semiconductor active layer 210 may be formed on the barrier layer 103. The first semiconductor active layer 204 and the second semiconductor active layer 210 may be formed of an inorganic semiconductor, e.g., amorphous silicon or polysilicon, or an organic semiconductor. The first gate insulating layer 208 is formed on the barrier layer 103 and covers the first semiconductor active layer 204 and the second semiconductor active layer 210.

The second gate electrode 211 is formed on the first gate insulating layer 208 and may overlap a portion of the second semiconductor active layer 210. The second gate insulating layer 209 covers the second gate electrode 211.

The first gate electrode 205 is formed on the second gate insulating layer 209 and may overlap a portion of the first semiconductor active layer 204. The first gate electrode 205 and the second gate electrode 211 include a single-layer structure of, e.g., gold (Au), silver (Ag), copper (Cu), nickel (Ni), platinum (Pt), palladium (Pd), aluminum (Al), molybdenum (Mo), chromium (Cr), or the like, a multi-layer structure thereof, or an alloy, e.g., Al:neodymium (Nd) or Mo:tungsten (W).

The first gate insulating layer 208 and the second gate insulating layer 209 may include an inorganic layer, e.g., silicon oxide, silicon nitride, or metal oxide. The first gate insulating layer 208 and the second gate insulating layer 209 may be formed in a single-layer or multi-layer structure as described above.

An interlayer insulating layer 214 covers the first gate electrode 205. The interlayer insulating layer 214 may be formed of an inorganic layer, e.g., silicon oxide, silicon nitride, or the like. According to an embodiment, the interlayer insulating layer 214 may be formed of an organic layer.

The first source electrode 206 and the first drain electrode 207 are formed on the interlayer insulating layer 214 and contact the first semiconductor active layer 204 via respective contact holes. In addition, the second source electrode 212 and the second drain electrode 213 are formed on the interlayer insulating layer 214 and contact the second semiconductor active layer 210 via respective contact holes. The first source electrode 206, the second source electrode 212, the first drain electrode 207, and the second drain electrode 213 include a metal, an alloy, metal nitride, conductive metal oxide, a transparent conductive material, or the like.

The above-described structure of the thin-film transistor TFT is not necessarily limited thereto, and various structures of the thin-film transistor TFT are applicable. For example, although the thin-film transistor TFT was described as being formed in a top gate structure, the thin-film transistor TFT may be formed in a bottom gate structure in which the first gate electrode 205 is disposed below the first semiconductor active layer 204.

A capacitor 215 may be formed in the circuit area CA. Alternatively, the capacitor 215 may be formed in the active area AA. The capacitor 215 includes a first capacitor electrode 216, a second capacitor electrode 217, and the second gate insulating layer 209 interposed between the first capacitor electrode 216 and the second capacitor electrode 217. The first capacitor electrode 216 may be formed of the same material as that of the second gate electrode 211, and the second capacitor electrode 217 may be formed of the same material as that of the first gate electrode 205.

A planarization layer 218 may be formed on the interlayer insulating layer 214 and covers the first and second thin-film transistors TFT1 and TFT2 and capacitor 215. The planarization layer 218 functions to clear and smooth a level difference of a thin film to increase emission efficiency of the organic light-emitting diode OLED to be formed thereon. The planarization layer 218 may have a through hole through which a portion of the first drain electrode 207 is exposed.

The planarization layer 218 may be formed of an insulating body. For example, the planarization layer 218 may be formed of an inorganic material, an organic material, or an organic/inorganic complex, formed in a single-layer or multi-layer structure, and formed by various deposition methods. According to an embodiment, the planarization layer 218 may be formed of an organic material, e.g., polyacrylate resin, epoxy resin, benzocyclobutene (BCB), or the like, or an inorganic material, e.g., silicon nitride ($SiN_x$) or the like. However, the present embodiment is not limited thereto, and any one of the planarization layer 218 and the interlayer insulating layer 214 may be omitted.

The organic light-emitting diode OLED is formed on the planarization layer 218. The organic light-emitting diode OLED includes a first electrode 219, an intermediate layer 220 including an organic emission layer, and a second electrode 221.

A pixel-defining layer 222 covers a portion of the planarization layer 218 and a portion of the first electrode 219, and defines a pixel area (PA) and a non-pixel area (NPA). The pixel-defining layer 222 may be formed of an organic material or an inorganic material. For example, the pixel-defining layer 222 may be formed of an organic material, e.g., polyimide, polyamide, BCB, acryl resin, phenol resin, or the like, or an inorganic material, e.g., $SiN_x$. The pixel-defining layer 222 may be formed in a single-layer structure or a multi-layer structure.

Holes and electrons injected from the first electrode 219 and the second electrode 221 of the organic light-emitting diode OLED may be bonded in the organic emission layer of the intermediate layer 220, thereby emitting light. For example, the intermediate layer 220 may include the organic emission layer. In another example, the intermediate layer 220 may include the organic emission layer and selectively further include at least one of a hole injection layer (HIL), a hole transport layer (HTL), an electron transport layer (ETL), and an electron injection layer (EIL). The present embodiment is not limited thereto, and the intermediate layer 220 may include the organic emission layer and may further include various function layers.

The second electrode 221 may be formed on the intermediate layer 220. The second electrode 221 forms an electric field together with the first electrode 219 to thereby allow the intermediate layer 220 to emit light. The first electrode 219 may be patterned for each pixel, and the second electrode 221 may be formed to apply a common voltage to all pixels. The first electrode 219 and the second electrode 221 may include a transparent electrode or a reflective electrode.

The first electrode 219 may act as an anode and may be formed of various conductive materials. The first electrode 219 may be formed as a transparent electrode or a reflective electrode. For example, when the first electrode 219 is used as a transparent electrode, the first electrode 219 includes a transparent conductive layer of, e.g., indium tin oxide (ITO), indium zinc oxide (IZO), zinc oxide (ZnO), indium oxide ($In_2O_3$), or the like. When the first electrode 219 is used as a reflective electrode, the first electrode 219 may include a reflective layer formed of, e.g., Ag, magnesium (Mg), Al, Pt, Pd, Au, Ni, Nd, iridium (Ir), Cr, a composition thereof, or the like and thereafter include a transparent layer of ITO, IZO, ZnO, $In_2O_3$, or the like on the reflective layer.

The second electrode 221 may act as a cathode. The second electrode 221 may be formed as a transparent electrode or a reflective electrode as well as the first electrode 219. For example, when the second electrode 221 is used as a transparent electrode, the second electrode 221 may be formed by depositing a metal having a low work function, e.g., lithium (Li), calcium (Ca), lithium fluoride (LiF)/Ca, LiF/Al, Al, or Mg, or a composition thereof, on the intermediate layer 220 and further forming a transparent conductive layer of, e.g., ITO, IZO, ZnO, $In_2O_3$, or the like, on the metal or the composition thereof. When the second electrode 221 is used as a reflective electrode, the second electrode 221 may be formed of, e.g., Li, Ca, LiF/Ca, LiF/Al, Al, Mg, or a composition thereof.

The first electrode 219 may act as an anode, and the second electrode 221 may act as a cathode. However, the present embodiment is not limited thereto. For example, the first electrode 219 may act as a cathode, and the second electrode 221 may act as an anode.

A spacer 234 may be disposed in the NPA. The spacer 234 may be disposed between the first substrate 101 and the second substrate 102, and may maintain a gap therebetween. By disposing the spacer 234, a display characteristic may not be deteriorated regardless of an external shock. The spacer 234 may be formed on the pixel-defining layer 222 such that the spacer 234 protrudes from the pixel-defining layer 222 toward the second substrate 102. The second electrode 221 may be disposed on the spacer 234.

Various circuit patterns may be formed in the circuit area CA. For example, a power supply pattern, an anti-electrostatic pattern, and other various circuit patterns may be formed in the circuit area CA.

According to an embodiment, the circuit wiring 223 is formed in the circuit area CA. The circuit wiring 223 may be formed on the planarization layer 218. The circuit wiring 223 may be formed of the same material as that of the first electrode 219. The circuit wiring 223 may be electrically connected to the second electrode 221 of the organic light-emitting diode OLED.

The circuit wiring 223 is connected to the power wiring 240. The power wiring 240 may be formed on the interlayer insulating layer 214. The power wiring 240 may be formed of the same material as that of the first source electrode 206, the second source electrode 212, the first drain electrode 207, and the second drain electrode 213. The power wiring 240 may be a wiring through which power is applied from the outside.

The second substrate 102 is boned onto the first substrate 101. The second substrate 102 may protect the organic light-emitting diode OLED and other thin films from external humidity, oxygen, and the like. The second substrate 102 may be a rigid glass substrate, a polymer substrate, or a flexible film. The second substrate 102 may have a structure in which an organic layer and an inorganic layer are alternately stacked.

The sealing part 500 is interposed between the first substrate 101 and the second substrate 102. The sealing part 500 includes a first sealing part 501 formed in the cell seal area CSA and a second sealing part 502 extending from the first sealing part 501 and formed in the circuit area CA. The first sealing part 501 and the second sealing part 502 may be formed in one body. In other words, the first and second sealing parts 501 and 502 may be a single, seamless structure, and the reference to the first and second sealing part 501 and 502 is made merely to facilitate description of the sealing part 500 with respect to the cell seal area CSA and the circuit area CA.

The first sealing part 501 is formed in the cell seal area CSA. For example, as illustrated in FIG. 2, lower and upper surfaces of the first sealing part 501 may directly contact the first and second substrates 101 and 102, respectively. The first sealing part 501 may be disposed around the circuit area CA, e.g., the first sealing part 501 may be disposed around the second sealing part 502.

The second sealing part 502 is formed in the circuit area CA. For example, as illustrated in FIG. 2, the second sealing part 502 extends continuously from the first sealing part 501 into the circuit area CA to at least partially overlap the first and second substrates 101 and 102, e.g., the second sealing part 502 may overlap and directly contact the second substrate 102 and the power wiring 240. As described above, the structure of the sealing part 500, i.e., a reduced width of the first sealing part 501 with the second sealing part 502, reduces dead space and increases adhesion between the first and second substrates 101 and 102, as at least a portion of the second sealing part 502 directly contacts the circuit wiring 223 or the power wiring 240.

The sealing part 500 including the first sealing part 501 and the second sealing part 502 includes glass frit. The glass frit includes glass powder and oxide powder. A gel-state paste is produced by adding an organic material to the glass frit, which includes oxide powder, and thereafter, the glass frit is calcined using a laser in a temperature range between about 300° C. and about 500° C. Accordingly, the organic material evaporates, and the gel-state paste is hardened, thereby resulting in a solid-state frit.

The second sealing part 502 may extend along the pixel-defining layer 222 included in the circuit area CA to reduce a dead space as described above, i.e., the second sealing part 502 may be formed to cover exposed surfaces of the pixel-defining layer 222 in the circuit area CA. For example, as illustrated in FIG. 2, a portion of the pixel-defining layer 222 in the circuit area CA may have a step structure above the power wiring 240, and the second sealing part 502 may be formed to cover the power wiring 240 and the exposed surfaces of the portion of the pixel-defining layer 222 with the step structure.

During application of the gel-state paste in the circuit area CA to form the second sealing part 502, a gap section could be generated at stepped portions of the power wiring 240 and the pixel-defining layer 222. Due to such a potential gap section, an effective sealing/bonding area by the second sealing part 502 could be reduced, and the adhesive force between the first substrate 101 and the second substrate 102 could be reduced, thereby decreasing the mechanical strength of the display device 1.

Therefore, according to example embodiments, the power wiring 240 includes a level-difference compensation part. The level-difference compensation part extends upward and reduces a degree of a level difference and a gradient formed in the circuit area CA between the power wiring 240 and the pixel-defining layer 222. That is, the level-difference compensation part reduces a height difference between uppermost surfaces of the power wiring 240 and the pixel-defining layer 222 in the circuit area CA.

It is noted, however, that while embodiments describe reducing a level difference between the power wiring 240 and the pixel-defining layer 222 in the circuit area CA, embodiments are not limited to a region between the power wiring 240 and the pixel-defining layer 222. For example, a level difference may also be reduced between the circuit wiring 223 and the planarization layer 218. Therefore, hereinafter, the power wiring 240 disposed in a region in the circuit area CA, in which the level-difference compensation part is formed, is referred to as a wiring part 240, and the pixel-defining layer 222 in the circuit area CA is referred to as a stepped part 222.

Figure 3A:
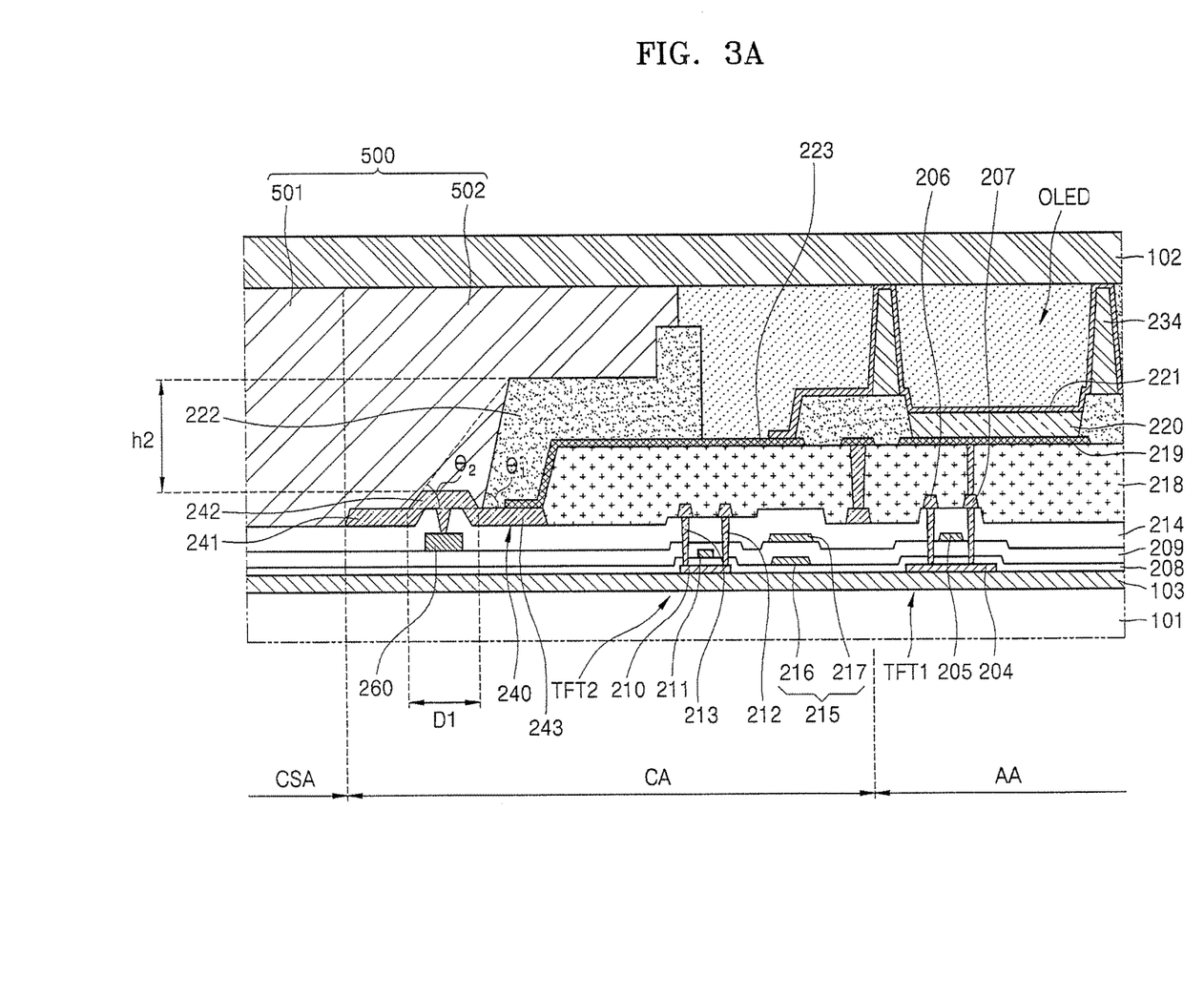
FIGS. 3A to 3C illustrate cross-sectional views of a portion of a display device according to other embodiments.
Figure 3B:
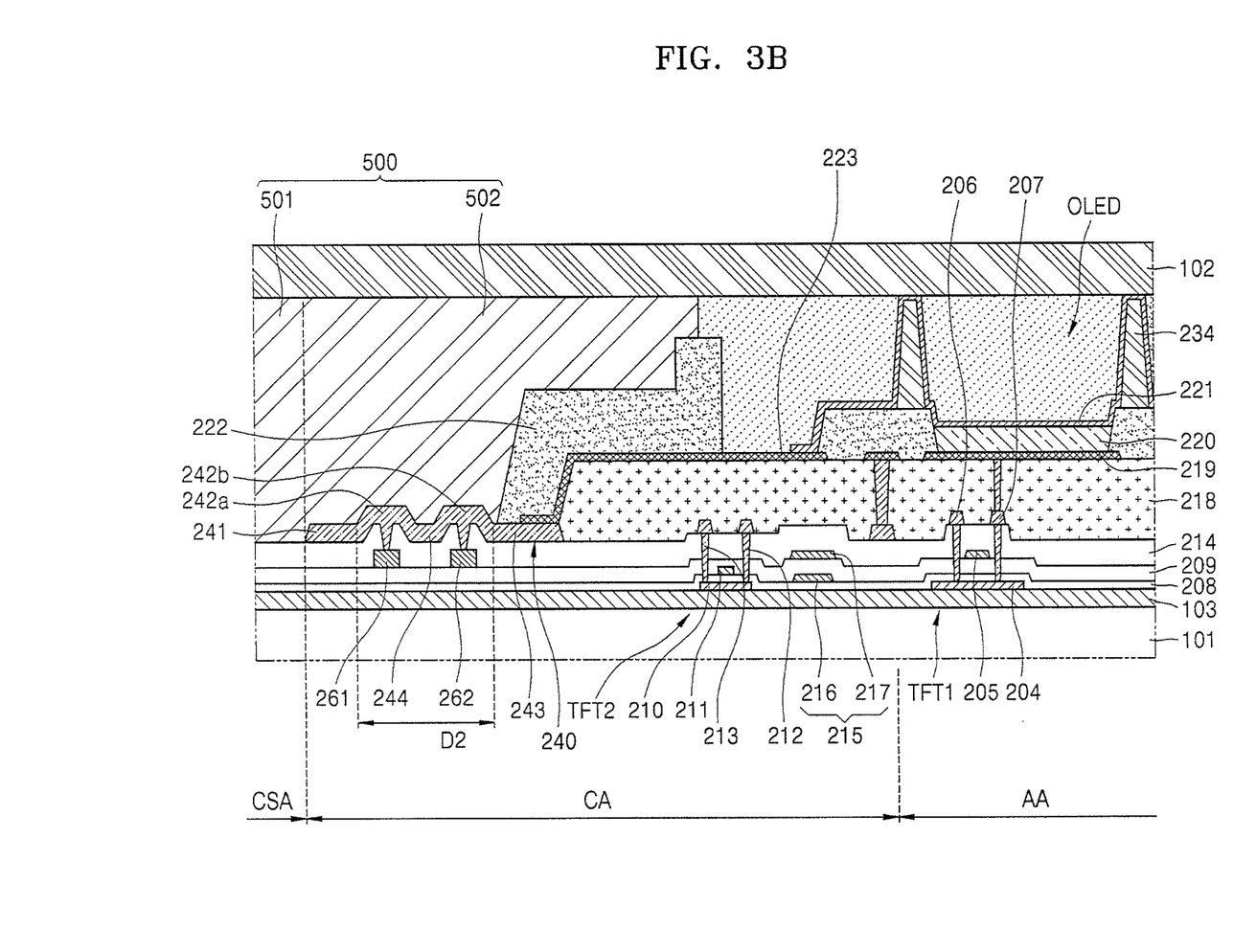
Figure 3C:
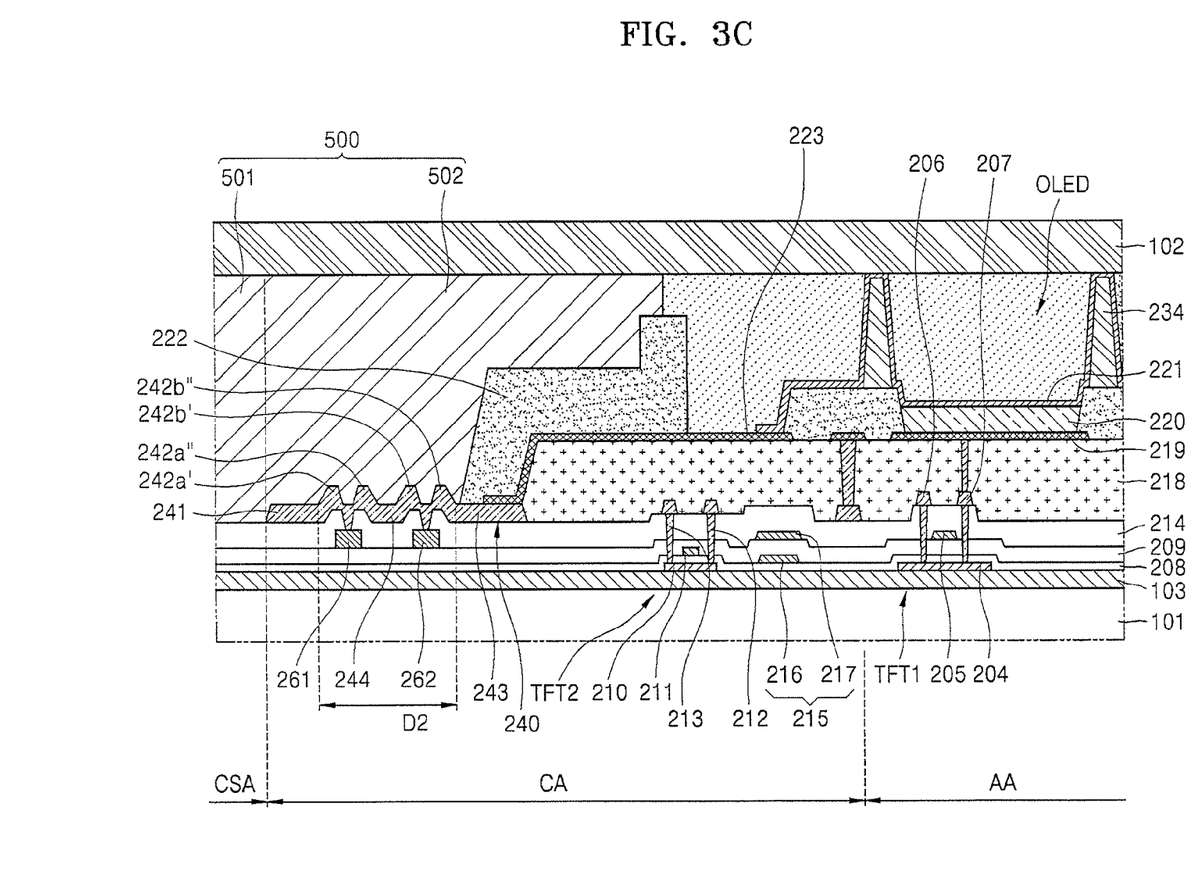

FIGS. 3A to 3C are cross-sectional views of a portion of the display device 1, according to other embodiments. A detailed configuration of the display device 1 shown in FIGS. 3A to 3C is substantially the same as the configuration shown in FIG. 2, and thus, a repeated description thereof is omitted.

Referring to FIG. 3A, a dummy metal layer 260 may be disposed below the wiring part 240, such that the dummy metal layer 260 overlaps a portion of the wiring part 240 and may form a level-difference compensation part 242 in the wiring part 240. In detail, the dummy metal layer 260 is formed on the second gate insulating layer 209 and is covered by the interlayer insulating layer 214. In this case, the wiring part 240 is disposed on the interlayer insulating layer 214, such that side portions 241 and 243 of the wiring part 240 are flat on the interlayer insulating layer 214, and the level-difference compensation part 242, which overlaps the dummy metal layer 260, protrudes above the side portions 241 and 243.

The dummy metal layer 260 may include a single-layer or multi-layer structure of, e.g., Au, Ag, Cu, Ni, Pt, Pd, Al, Mo, Cr, or the like, or an alloy, e.g., Al:Nd or Mo:W.

The level-difference compensation part 242 may be formed to have a predetermined width D1. For example, the width D1 of the level-difference compensation part 242 may be formed in a range of about 50 μm or less. In this case, a width of the metal layer 260 may be formed according to the width D1 of the level-difference compensation part 242.

The level-difference compensation part 242 may be formed on the interlayer insulating layer 214, may compensate for a level difference between the stepped part 222 and the wiring part 240, and may make up for a gradient angle θ. For example, referring to FIGS. 2 and 3A, by forming the level-difference compensation part 242 on the interlayer insulating layer 214, a first level difference h1 between an upper end portion of the wiring part 240 and an upper end portion of the stepped part 222 (FIG. 2) may be reduced to a second level difference h2 between an upper end portion of the level-difference compensation part 242 and the upper end portion of the stepped part 222 (FIG. 3A). In addition, the level-difference compensation part 242 may reduce a first gradient angle θ1 formed between the wiring part 240 and the stepped part 222 (FIG. 2) to a second gradient angle θ2, thereby alleviating a gradient.

According to the reduction of a level difference h and the gradient angle θ between the wiring part 240 and the stepped part 222, the gel-state paste of the glass frit interposed and pressed between the first substrate 101 and the second substrate 102 may be relatively uniformly distributed, thereby reducing a gap section which may be formed between the wiring part 240 and the stepped part 222. According to the reduction of the gap section, the effective sealing/bonding area due to the second sealing part 502 may increase, and the adhesive force between the first substrate 101 and the second substrate 102 may increase, thereby improving the mechanical strength of the display device 1.

The level-difference compensation part 242 may be formed in plural numbers, and a portion of the plurality of level-difference compensation parts 242 may be separated and formed in a shape of a plurality of protrusion parts 242a', 242a", 242b', and 242b". For example, referring to FIGS. 3B and 3C, a first dummy metal layer 261 and a second dummy metal layer 262 may be disposed on the second gate insulating layer 209, such that the first dummy metal layer 261 and the second dummy metal layer 262 are spaced with a predetermined distance therebetween, and the interlayer insulating layer 214 covers the first dummy metal layer 261 and the second dummy metal layer 262. In this case, the wiring part 240 is disposed on the interlayer insulating layer 214, and portions of the wiring part 240 overlapping the first and second dummy metal layers 261 and 262 protrude above portions 241, 243, and 244, thereby forming a plurality of level-difference compensation parts 242a and 242b.

The plurality of level-difference compensation parts 242a and 242b may be formed to have a predetermined width D2. For example, the width D2 of the plurality of level-difference compensation parts 242a and 242b may be formed in a range of about 50 μm or less from the stepped part 222, and as described above, a width of and a spacing distance between the first and second dummy metal layers 261 and 262 may be determined according to the width D2 of the plurality of level-difference compensation parts 242a and 242b.

According to the formation of the plurality of level-difference compensation parts 242a and 242b, the effective sealing/bonding area due to the second sealing part 502 may increase, and the adhesive force between the first substrate 101 and the second substrate 102 may increase, thereby improving the mechanical strength of the display device 1.

In FIG. 3B, only the plurality of level-difference compensation parts 242a and 242b are formed, but the present embodiment is not limited thereto, and two or more level-difference of the compensation parts 242a and 242b may be formed. In addition, referring to FIG. 3C, by additionally disposing the separate protrusion parts 242a', 242a", 242b', and 242b" on the plurality of level-difference compensation parts 242a and 242b, the effective sealing/bonding area between the second sealing part 502 and the wiring part 240 may further increase, thereby improving the mechanical strength of the display device 1.

As described above, a plurality of the level-difference compensation parts 242 may be formed, and first and second level-difference compensation parts 242-1 and 247 may be disposed in a stack structure. For example, referring to FIGS. 4A and 4B, the first dummy metal layer 261 is formed on the first gate insulating layer 208, and is covered by the second gate insulating layer 209. The second dummy metal layer 262 is formed on the second gate insulating layer 209 such that the second dummy metal layer 262 overlaps the first dummy metal layer 261, and the interlayer insulating layer 214 covers the second dummy metal layer 262. In this case, the wiring part 240 is disposed on the interlayer insulating layer 214, a portion of the wiring part 240, which overlaps the first dummy metal layer 261, may be formed as the first level-difference compensation part 242-1 which protrudes above side portions 241 and 243, and a portion of the wiring part 240, which overlaps the second dummy metal layer 262, may be formed as the second level-difference compensation part 247.

Figure 4A:
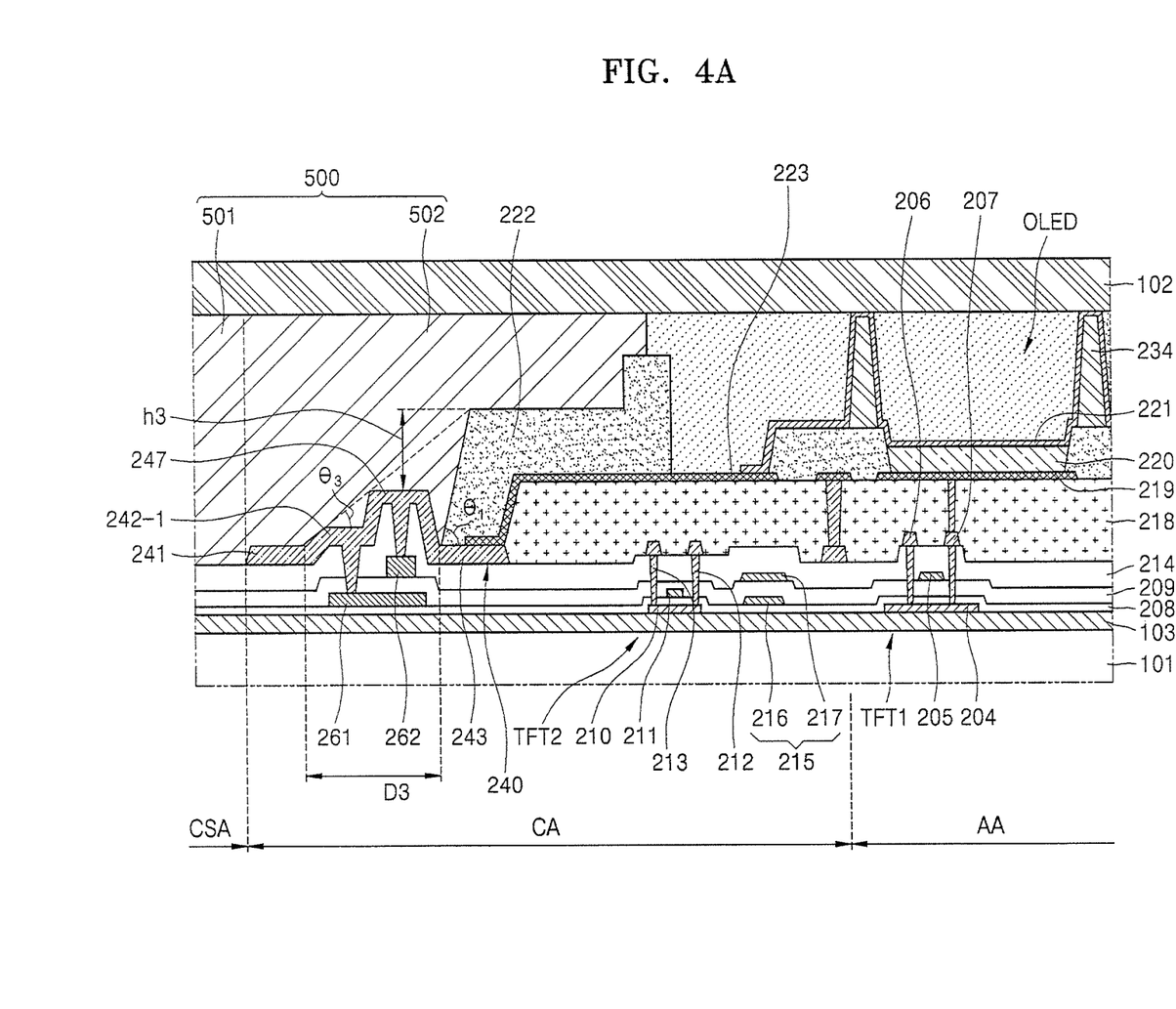
FIGS. 4A and 4B illustrate cross-sectional views of a portion of a display device according to yet other embodiments.
Figure 4B:
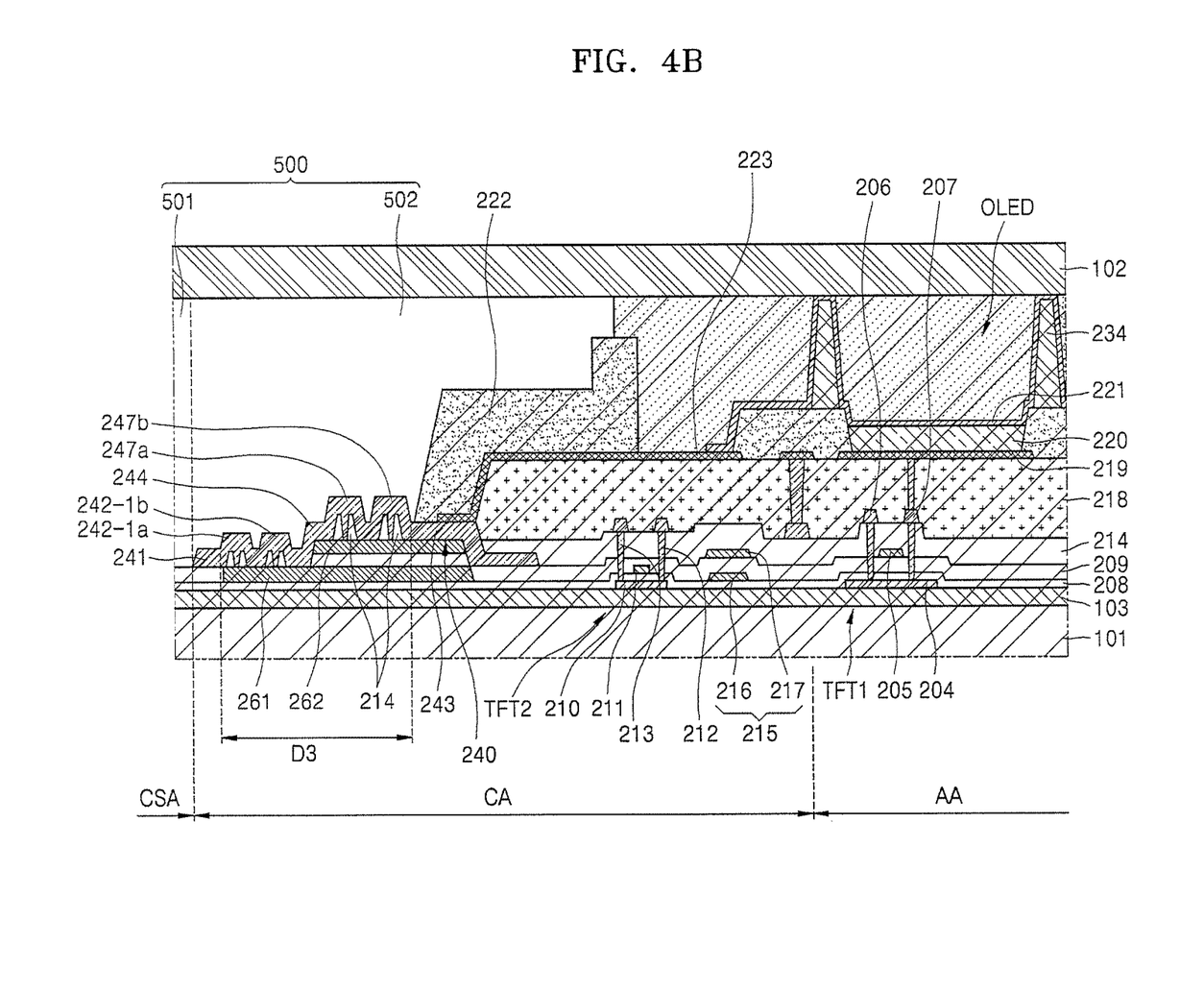

The first and second level-difference compensation parts 242-1 and 247 may be formed on the interlayer insulating layer 214, compensate for the level difference between the stepped part 222 and the wiring part 240, and make up for the gradient angle θ. In this case, the first and second level-difference compensation parts 242-1 and 247 may be formed to have a predetermined width D3, e.g., formed in a range of about 50 μm or less from the stepped part 222. When the first and second level-difference compensation parts 242-1 and 247 are formed in a range of having the predetermined width D3, by disposing the first and second level-difference compensation parts 242-1 and 247 in a stack structure, the level difference h between the upper end part of the wiring part 240 and the upper end part of the stepped part 222 may be reduced, and the gradient angle θ formed between the wiring part 240 and the stepped part 222 may be further alleviated.

For example referring to FIGS. 3A and 4A, by disposing the first and second level-difference compensation parts 242-1 and 247 in a stack structure, the second level difference h2 between the upper end portion of the level-difference compensation part 242 and the upper end portion of the stepped part 222 may be reduced to a third level difference h3 between an upper end portion of the second level-difference compensation part 247 and the upper end portion of the stepped part 222. In addition, the first and second level-difference compensation parts 242-1 and 247 may reduce the second gradient angle θ2 formed between the wiring part 240 and the stepped part 222 to a third gradient angle θ3, thereby alleviating a gradient.

According to the reduction of the level difference h and the gradient angle θ between the wiring part 240 and the stepped part 222, the gel-state paste of the glass fit interposed and pressed between the first substrate 101 and the second substrate 102 may be relatively uniformly distributed, thereby further reducing a gap section which may be formed between the wiring part 240 and the stepped part 222. According to the reduction of the gap section, the effective sealing/bonding area due to the second sealing part 502 may increase, and the adhesive force between the first substrate 101 and the second substrate 102 may increase, thereby improving the entire mechanical strength of the display device 1.

When an uneven part is formed on the first and second level-difference compensation parts 242-1 and 247, the effective sealing/bonding area due to the second sealing part 502 may increase, and the adhesive force between the first substrate 101 and the second substrate 102 may increase, thereby improving the entire mechanical strength of the display device 1. Referring to FIG. 4B, by additionally disposing separate uneven parts 242-1a, 242-1b, 247a, and 247b on the first and second level-difference compensation parts 242-1 and 247, the effective sealing/bonding area between the second sealing part 502 and the wiring part 240 may further increase, thereby improving the entire mechanical strength of the display device 1.

As described above, according to the one or more of the above exemplary embodiments, a display device may secure not only an effective sealing width but also an effective sealing/bonding area, thereby increasing a bonding strength between a first substrate and a second substrate. In contrast, when a plurality of substrates are bonded by interposing a conventional sealing member between upper and lower substrates and applying predetermined energy thereto, the conventional sealing member may melt, thereby reducing structural/mechanical strength of the display.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A display device, comprising:
    a first substrate having an active area, a circuit area extending outwardly from the active area, and a cell seal area extending outwardly from the circuit area;
    a first insulating layer on the first substrate;
    a second insulating layer on the first insulating layer;
    a driving thin-film transistor in the active area, the driving thin-film transistor including;
        a gate electrode on the first insulating layer;
        a source electrode on the second insulating layer;
        a drain electrode on the second insulating layer;
    an organic light-emitting diode having an anode electrode electrically connected to the driving thin-film transistor, a cathode electrode and an organic emission layer between the cathode electrode and the anode electrode;
    a first metal layer on the first insulating layer in a circuit area; and
    a power wiring part on the second insulating layer in a circuit area and electrically connected to the cathode electrode in the active area;
    wherein the power wiring part is connected to the first metal layer via contact hole, and
    wherein a portion of the power wiring part overlying the first metal layer protrudes away from the first substrate such that the power wiring part includes a first level-difference compensation part aligned with the first metal layer.

2. The display device as claimed in claim 1, further comprising:
    a second substrate covering the first substrate; and
    a sealing part between the first substrate and the second substrate, wherein at least a portion of the power wiring part directly contacts the sealing part.

3. The display device as claimed in claim 2, further comprising a stepped part between the sealing part and at least a portion of the power wiring part, and the first level-difference compensation part in the power wiring part being adjacent to the stepped part.

4. The display device as claimed in claim 3, wherein the first level-difference compensation part includes a plurality of protrusion parts thereon such that the distal end of the first level-difference compensation part includes two peaks with a valley therebetween.

5. The display device as claimed in claim 3, wherein a width of the first level-difference compensation part is about 50 μm or less.

6. The display device as claimed in claim 1, wherein the power wiring part, the source electrode and the drain electrode include the same material.

7. The display device as claimed in claim 6, wherein the power wiring part, the source electrode and the drain electrode include at least one of a metal, an alloy, metal nitride, conductive metal oxide and a transparent conductive material.

8. The display device as claimed in claim 1, further comprising a second metal layer on the first insulating layer, wherein the power wiring part is connected to the second metal layer via contact hole,
    wherein a portion of the power wiring part overlying the second metal layer protrudes away from the substrate such that the power wiring part includes a second level-difference compensation part aligned with the second metal layer, the second level-difference compensation part having a distal end that is farther from the substrate than a distal end of portions of the power wiring part laterally adjacent to the second level-difference compensation part.

9. The display device as claimed in claim 8, wherein the first metal layer and the second metal layer are respectively disposed below the first level-difference compensation part and the second level-difference compensation part.

10. The display device as claimed in claim 8, wherein the power wiring part further includes at least one additional level-difference compensation part such that the power wiring part includes a plurality of level-difference compensation parts disposed in a line with a predetermined spacing.

11. The display device as claimed in claim 8, wherein the gate electrode, the first metal layer and the second metal layer include the same material.

12. The display device as claimed in claim 11, wherein the gate electrode, the first metal layer and the second metal layer is a single-layer or multi-layer structure including, Au, Ag, Cu, Ni, Pt, Pd, Al, Mo, Cr.

13. The display device as claimed in claim 3, wherein:
the circuit area extends outwardly along a first direction from the active area,
the cell seal area extends outwardly from the circuit area outwardly along the first direction,
the first level-difference compensation part extends in a second direction, orthogonal to the first direction,
the first level-difference compensation part of the wiring part overlapping the stepped part along the second direction and extending beyond the stepped part along the first direction towards the cell seal area.

14. A display device, comprising:
a first substrate having an active area, a circuit area extending outwardly from the active area, and a cell seal area extending outwardly from the circuit area;
a first insulating layer on the first substrate;
a second insulating layer on the first insulating layer;
a driving thin-film transistor in the active area, the driving thin-film transistor including;
  a gate electrode on the first insulating layer;
  a source electrode on the second insulating layer;
  a drain electrode on the second insulating layer;
an organic light-emitting diode having an anode electrode electrically connected to the driving thin-film transistor, a cathode electrode and an organic emission layer between the cathode electrode and the anode electrode;
a first metal layer on the first insulating layer in a circuit area; and
a power wiring part on the second insulating layer in a circuit area and electrically connected to the cathode electrode in the active area;
wherein the power wiring part is connected to the first metal layer via contact hole, and
wherein a portion of the power wiring part overlying the first metal layer protrudes away from the first substrate such that the power wiring part includes a first level-difference compensation part aligned with the first metal layer, the first level-difference compensation part having a distal end that is farther from the substrate than a distal end of portions of the power wiring part laterally adjacent to the first level-difference compensation part.

* * * * *